(12) United States Patent
Chen et al.

(10) Patent No.: US 7,494,408 B2
(45) Date of Patent: Feb. 24, 2009

(54) FAN HOLDER

(75) Inventors: Yun-Lung Chen, Shenzhen (CN); Qing-Hao Wu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 168 days.

(21) Appl. No.: 11/308,820

(22) Filed: May 11, 2006

(65) Prior Publication Data

US 2007/0155301 A1 Jul. 5, 2007

(30) Foreign Application Priority Data

Dec. 30, 2005 (CN) .................... 2005 2 0121449

(51) Int. Cl.
 *H05K 5/00* (2006.01)
 *H05K 7/20* (2006.01)
(52) U.S. Cl. ........................ 454/184; 361/695
(58) Field of Classification Search ........... 454/184; 361/695

See application file for complete search history.

(56) References Cited

U.S. PATENT DOCUMENTS

| | | | |
|---|---|---|---|
| 6,236,564 B1 * | 5/2001 | Fan | 361/695 |
| 6,817,939 B2 | 11/2004 | Gan et al. | |
| 6,826,048 B1 * | 11/2004 | Dean et al. | 361/695 |
| 6,860,323 B2 | 3/2005 | Cheng | |

* cited by examiner

*Primary Examiner*—Steve McAllister
*Assistant Examiner*—Helena Kosanovic
(74) *Attorney, Agent, or Firm*—Wei Te Chung (57) ABSTRACT

A fan holder assembly comprises a panel defining a plurality of latching holes therein, a first fan, a second fan, and a holder securely attached to the panel for securing either the first fan or the second fan. The holder comprises a bottom plate having a plurality of catches, a plurality of first clasping portions extending from the bottom plate, and a plurality of second clasping portions extending from the bottom plate. The first clasping portions are situated below the second clasping portions. The catches engage in the latching holes of the panel respectively, thereby fixedly attaching the holder to the panel. The first clasping portions engage with the first fan for securing the first fan. The second clasping portions engage with the second fan for securing the second fan.

16 Claims, 7 Drawing Sheets

FAN HOLDER

FIELD OF THE INVENTION

The present invention relates to fan holders, and more particularly to a fan holder which alternatively secures fans of different size to a panel of a computer enclosure.

DESCRIPTION OF RELATED ART

Nowadays, most computer systems employ a plurality of electronic devices, such as a central processing unit (CPU) and a power supply, which generate a lot of heat during normal operation. This may deteriorate their operational stability and damage associated electronic equipment. Thus, the heat must be removed quickly to ensure normal operation. A conventional heat dissipation device including a fan is attached to a top surface of a CPU, to remove heated air therefrom. However, the use of only one fan does not always effectively dissipate heated air generated from modern powerful CPUs. Accordingly, an additional fan is often installed on a panel of a computer enclosure, to take outside air into the enclosure, thereby further cooling air in the computer enclosure. Generally, the additional fan is securely attached to the enclosure with screws. One significant disadvantage of a screw-secured fan is that the screws may be inadvertently dropped into the computer enclosure during installation and removal of the fan. Furthermore, the mounting procedure is unduly tedious and inconvenient due to the need for using a tool, especially when the enclosure is small. Moreover, other components in the enclosure may be accidentally damaged during the attachment procedure.

A typical holder for securing a fan to a panel of a computer enclosure includes a base for supporting the fan thereon, and a tapered hood-shaped body extending from the base. The body includes a pair of side walls, and top and bottom walls respectively connecting between the side walls. A pair of latches extends outwardly from an edge of the top wall that is distal from the base. A pair of retaining slots is respectively defined in the side walls. An actuator extends outward from one of the side walls, and includes a handle and a protrusion. The panel defines a pair of spaced cutouts engagingly receiving the latches of the holder, a slit snappingly receiving the protrusion of the holder, and a pair of hooks engaging in the slots of the holder. Although it is unnecessary to use screws in assembly of the fan holder, the fan is not easily removable from the enclosure and is not replaceable with another fan of different dimensions when maintenance or replacement is required. Thus, an improved holder, which solves the above-mentioned problems, is strongly desired.

What is needed, therefore, is a fan holder which alternatively secures fans of different size to a panel of a computer enclosure.

SUMMARY OF INVENTION

A fan holder assembly comprises a panel defining a plurality of latching holes therein, a first fan, a second fan, and a holder securely attached to the panel for securing either the first fan or the second fan. The holder comprises a bottom plate having a plurality of catches, a plurality of first clasping portions extending from the bottom plate, and a plurality of second clasping portions extending from the bottom plate. The first clasping portions are situated below the second clasping portions. The catches engage in the latching holes of the panel respectively, thereby fixedly attaching the holder to the panel. The first clasping portions engage with the first fan for securing the first fan. The second clasping portions engage with the second fan for securing the second fan.

Other advantages and novel features will be drawn from the following detailed description of preferred embodiments with the attached drawings, in which:

DETAILED DESCRIPTION

Figure 1:
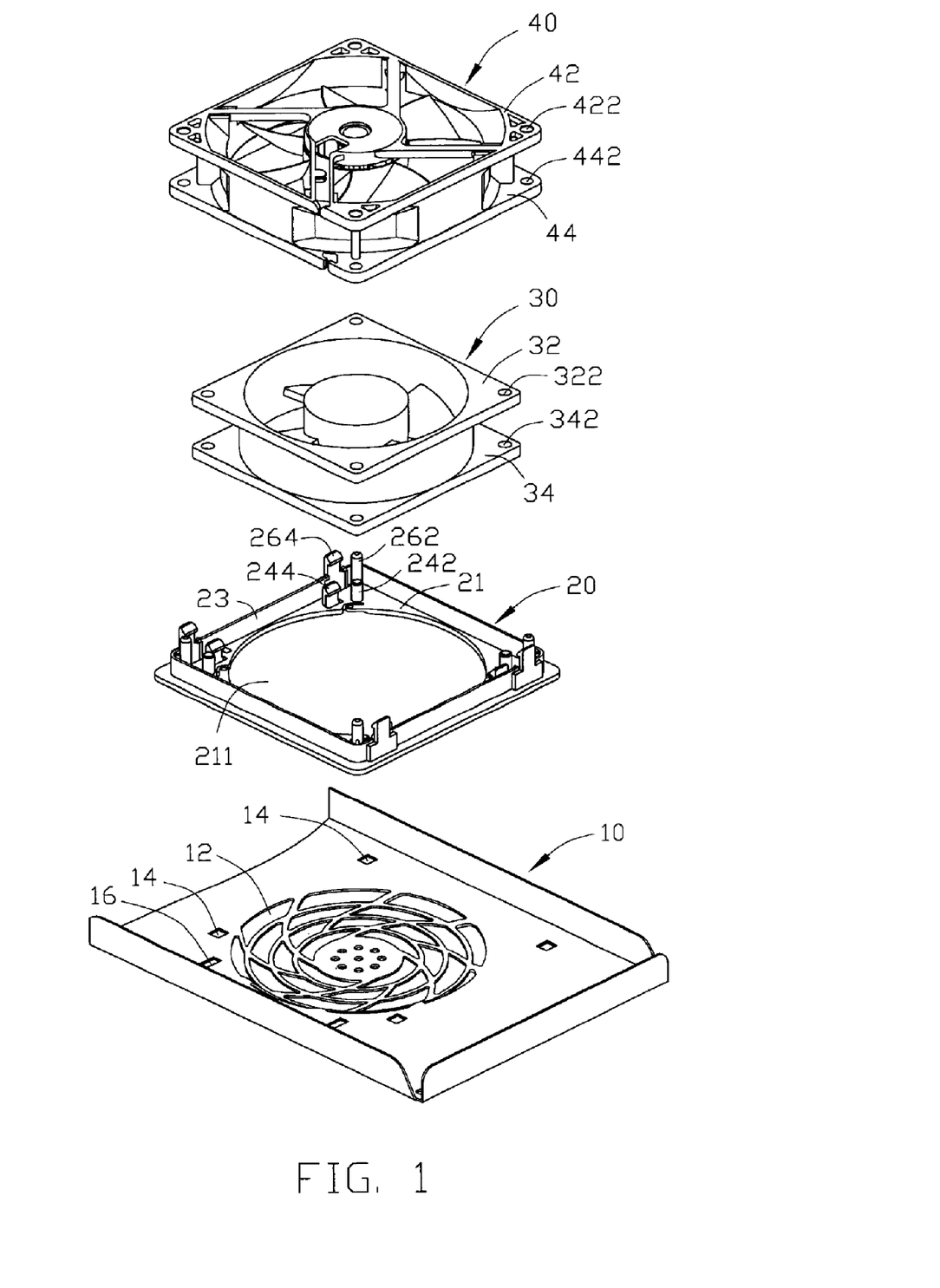
FIG. 1 is an exploded, isometric view of a fan holder in accordance with a preferred embodiment of the invention, together with a panel of a computer enclosure, a first fan, and a second fan.
Figure 2:
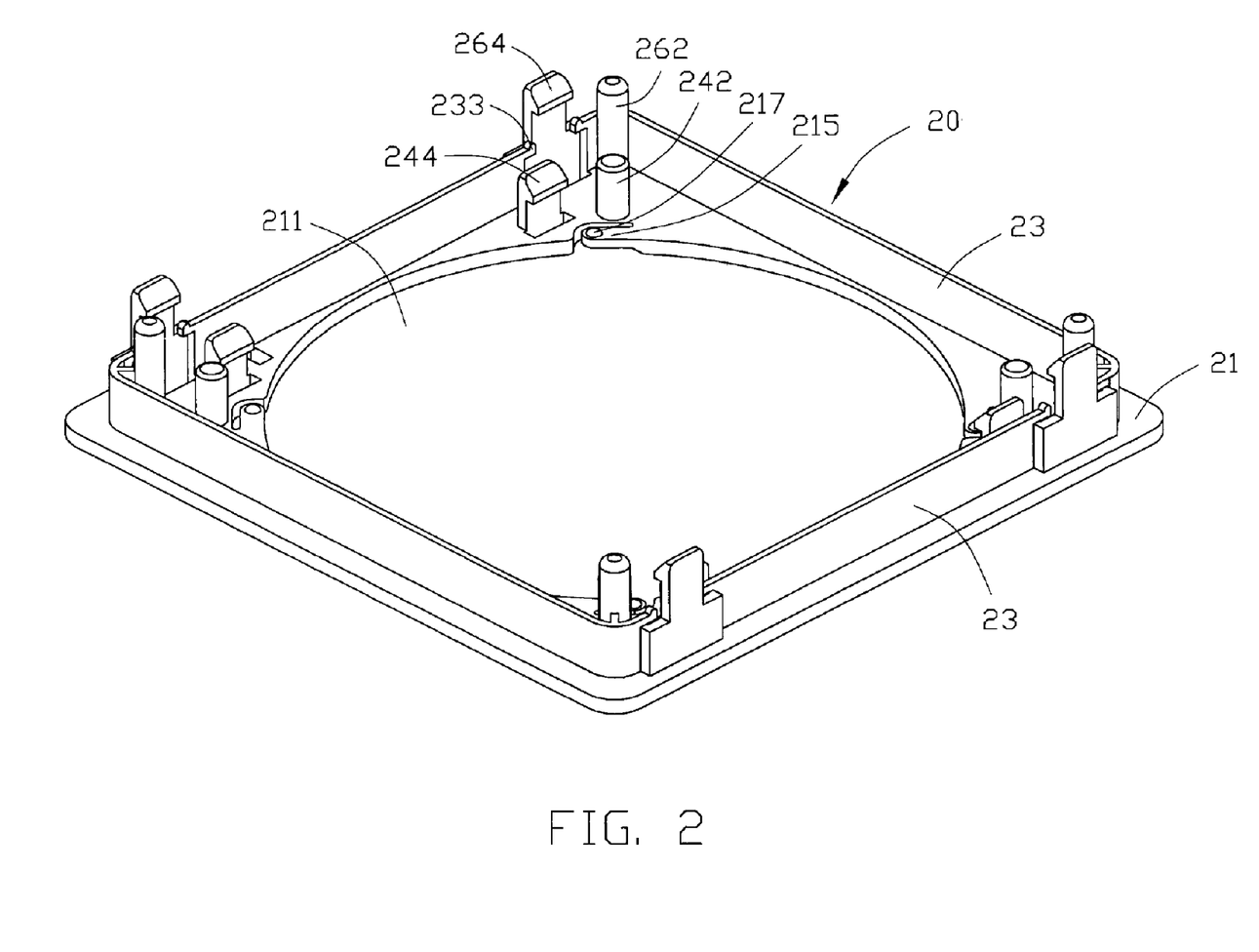
FIG. 2 is an enlarged view of the fan holder of FIG. 1.
Figure 3:
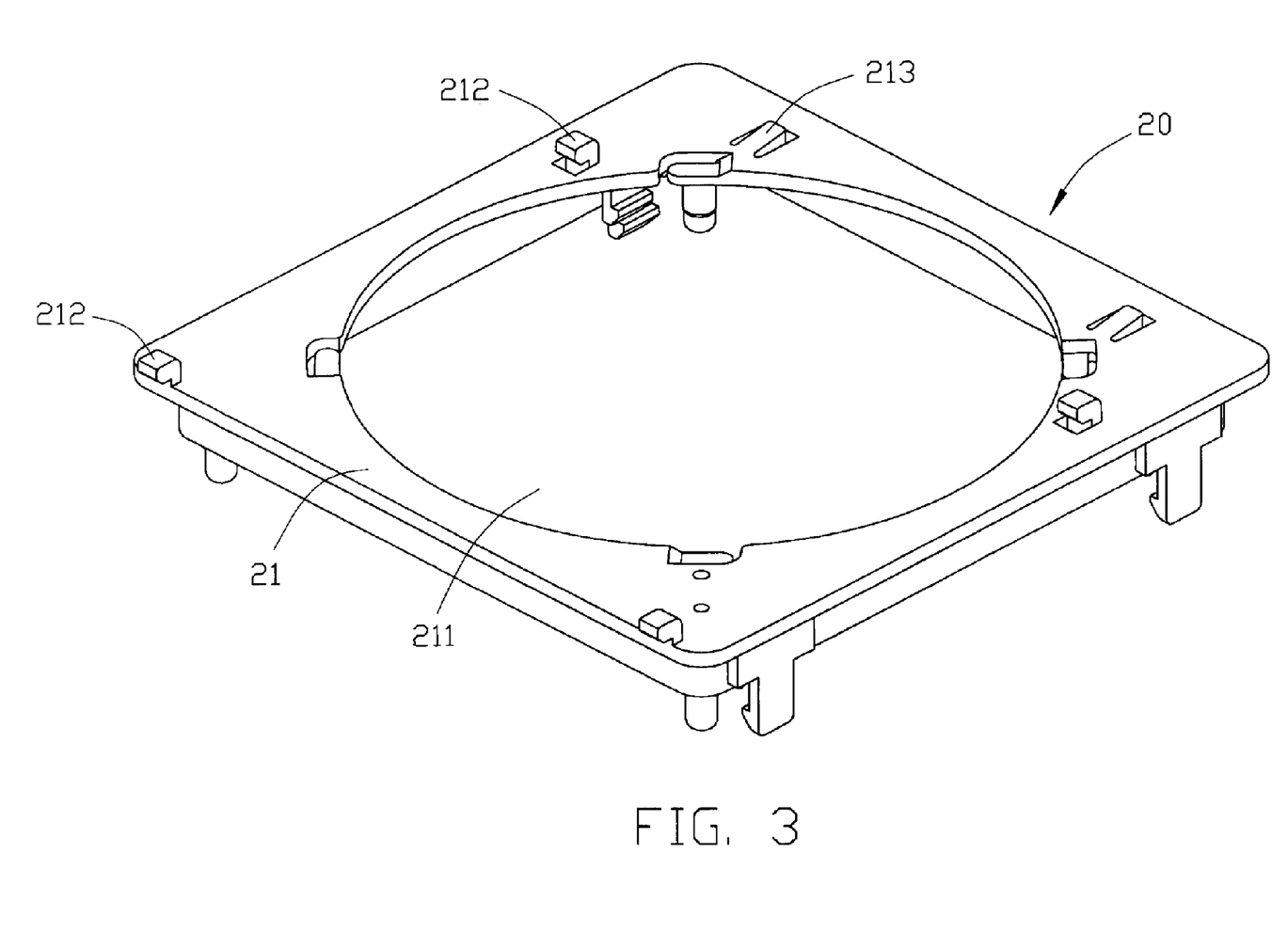
FIG. 3 is another enlarged view of the fan holder of FIG. 1, but viewed from another aspect.

Referring to FIGS. 1, 2, and 3, a holder 20 in accordance with a preferred embodiment of the invention, is used to secure a first fan 30 or a second fan 40 to a front panel 10 of a computer enclosure (not shown).

The front panel 10 of the computer enclosure defines a plurality of variform vents 12 therein for drawing air from outside the enclosure. Four rectangular latching holes 14 are defined in a generally square pattern around the vents 12 of the front panel 10. A pair of positioning holes 16 is defined in the front panel 10 adjacent each of two latching holes 14.

The holder 20 is securely mounted to the front panel 10 of the computer enclosure. The holder 20 includes a bottom plate 21 and four side plates 23 extending perpendicularly from the bottom plate 21, for supporting the second fan 40. A circular opening 211 is defined in the center of the bottom plate 21 for drawing air from outside the computer enclosure. The circular opening 211 is surrounded by the four side plates 23 to form a receiving space for receiving the first fan 30. Four L-shaped catches 212 extend from the bottom surface of the bottom plate 21 around the circular opening 211. Furthermore, two of the four catches 212 are symmetrically formed along an edge of the bottom plate 21. A pair of elastic latching blocks 213, adjacent to the other two catches 212, is formed on the bottom surface of the bottom plate 21 by stamping. The bottom plate 21 is symmetrically formed to have four elastic fingers 215 with a projection 217 along an edge of the circular opening 211 by stamping. A first locating post 242 and a first clasping portion 244 extend perpendicularly from the bottom plate 21 adjacent to each finger 215, for securing the first fan 30. A second locating post 262 and a second clasping portion 264 extend perpendicularly from the bottom plate 21, outside each of the first locating posts 242 and each of the first clasping portions 244 consecutively, for securing the second fan 40. Moreover, each of the second clasping portions 264 is situated at an outside of corresponding side plates 23. In the preferred embodiment, the first and second clasping portions 244, 264 may be an inversed inward facing hook or the like. The height of each of the first locating posts 242 and each of first clasping portions 244 is not more than the height of the side plates 23. An elastic projecting end 233 is formed at a top edge and near each end of two opposite side plates 23 adjacent each second clasping portion 264.

A typical dimension for the first fan 30 is 80×80×25 mm. The first fan 30 has an upper panel 32 and a lower panel 34. Coaxial mounting holes 322, 324 are defined at each of the corners of the upper and lower panel 32, 34.

A typical dimension for the second fan 40 is 92×92×25 mm. The second fan 40 has an upper panel 42 and a lower panel 44. Coaxial mounting holes 422, 424 are defined at each of the corners of the upper and lower panel 42,44.

Figure 4:
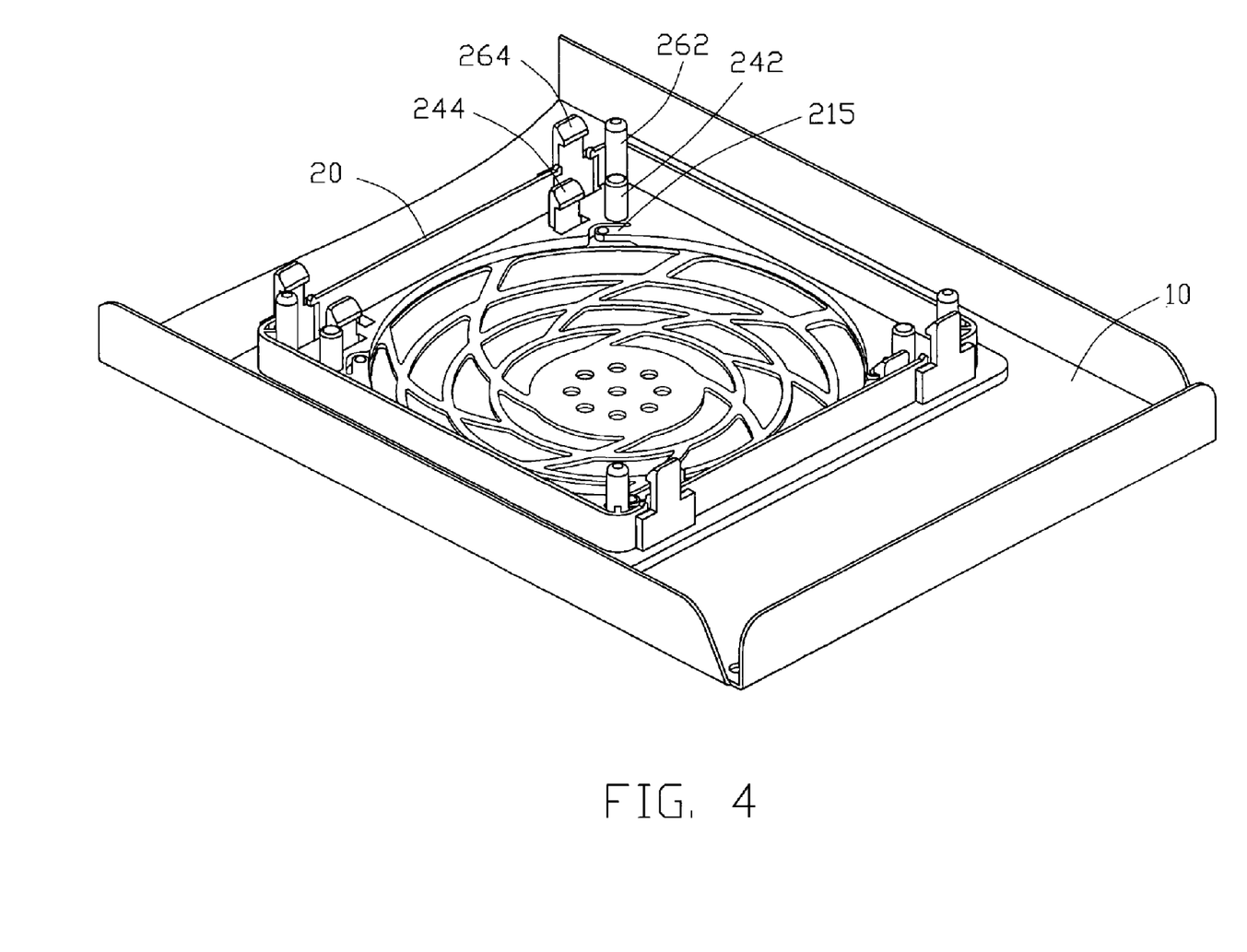
FIG. 4 is a pre-assembled view of the fan holder of FIG. 1.
Figure 5:
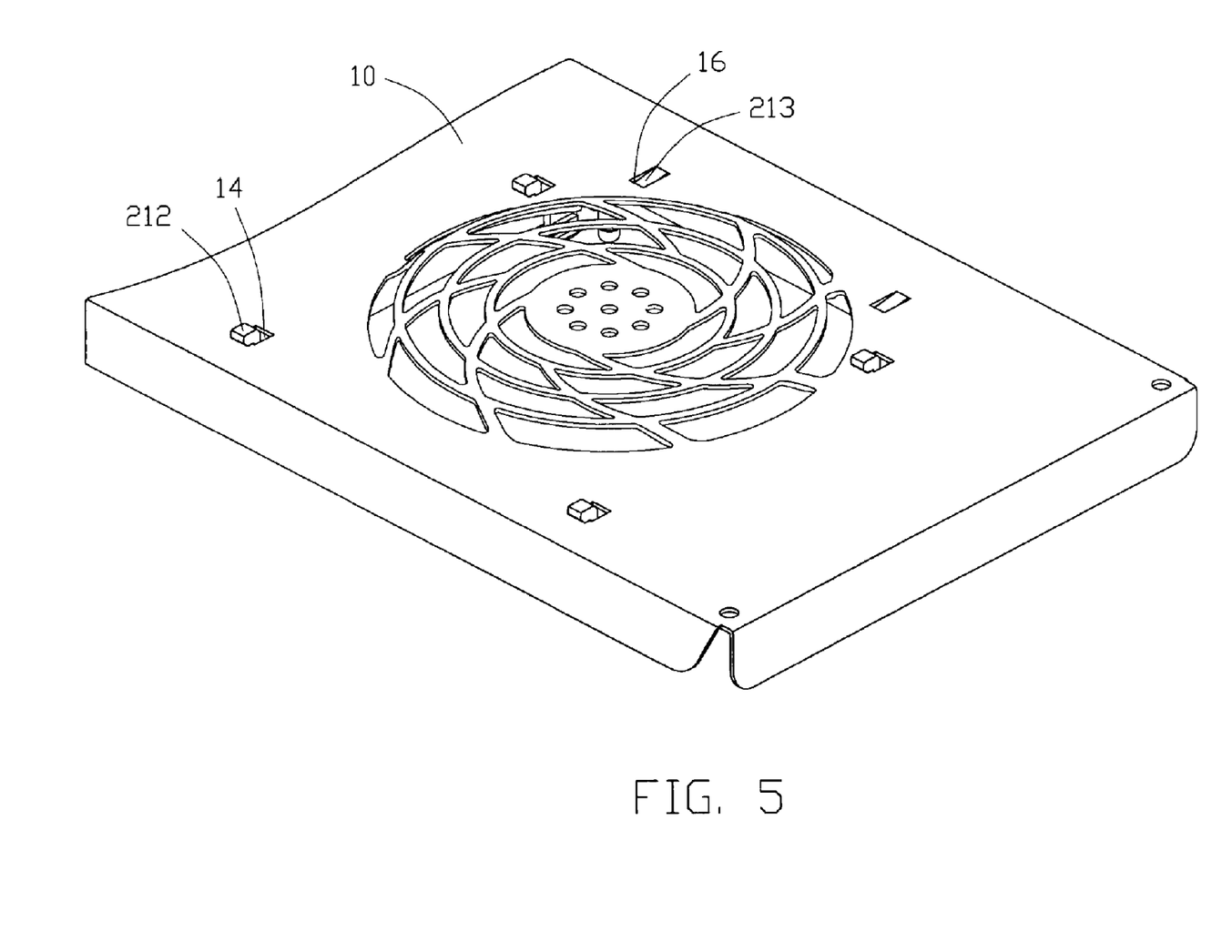
FIG. 5 is another pre-assembled view of the fan holder of FIG. 1, but viewed from another aspect.

Referring to FIGS. 4 and 5, in assembly of the holder 20, the four catches 212 are first aligned with and then extended through the corresponding latching holes 14 of the front panel 10. Then, the holder 20 is pressed against the front panel 10 and moved horizontally until each of the elastic latching blocks 213 is engagingly received in the corresponding positioning hole 16. Simultaneously, the catches 212 engage in the corresponding latching holes 14. The holder 20 is thus fixedly mounted on the front panel 10.

Figure 6:
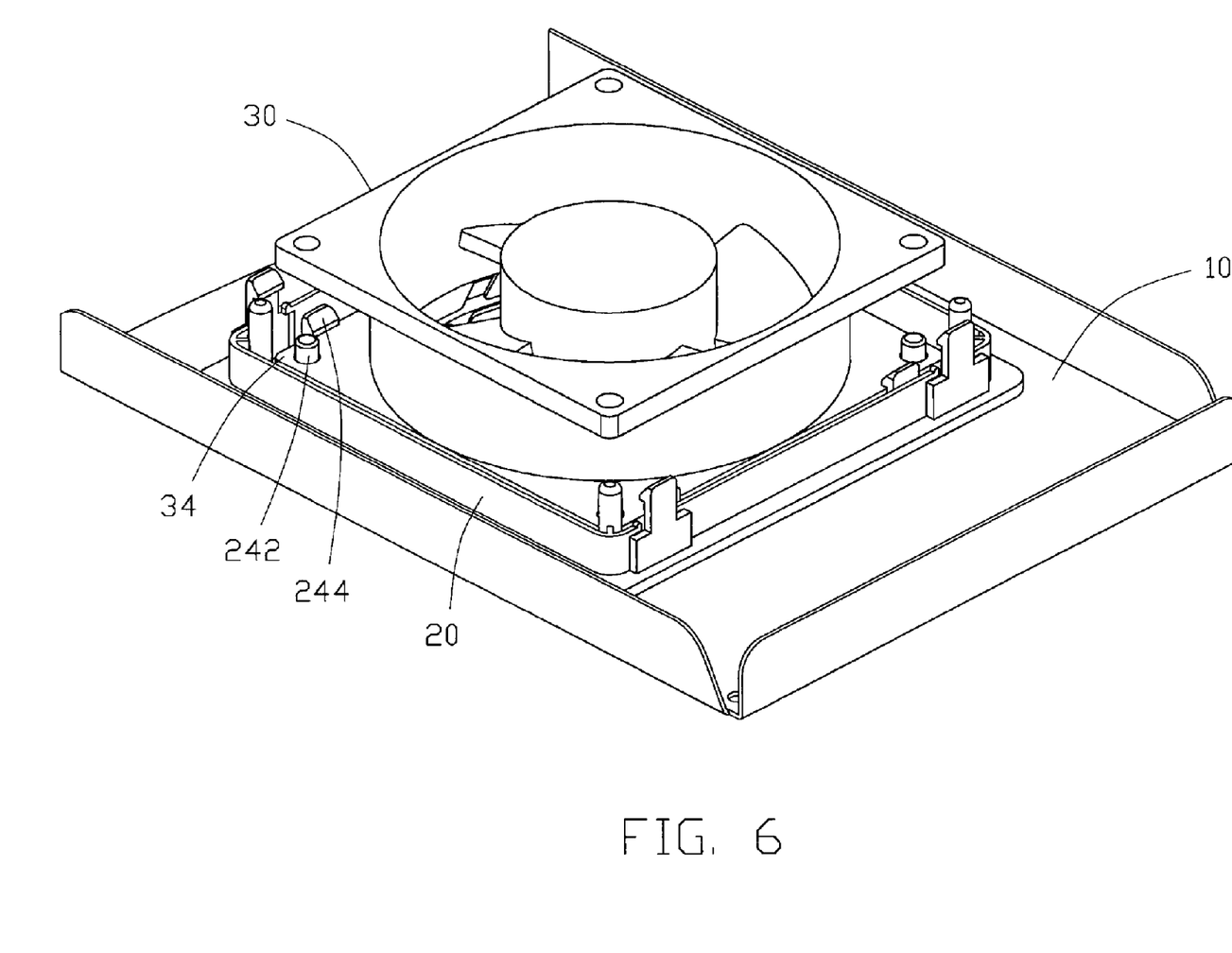
FIG. 6 is an assembled view of the fan holder of FIG. 1, with the first fan mounted to the fan holder.
Figure 7:
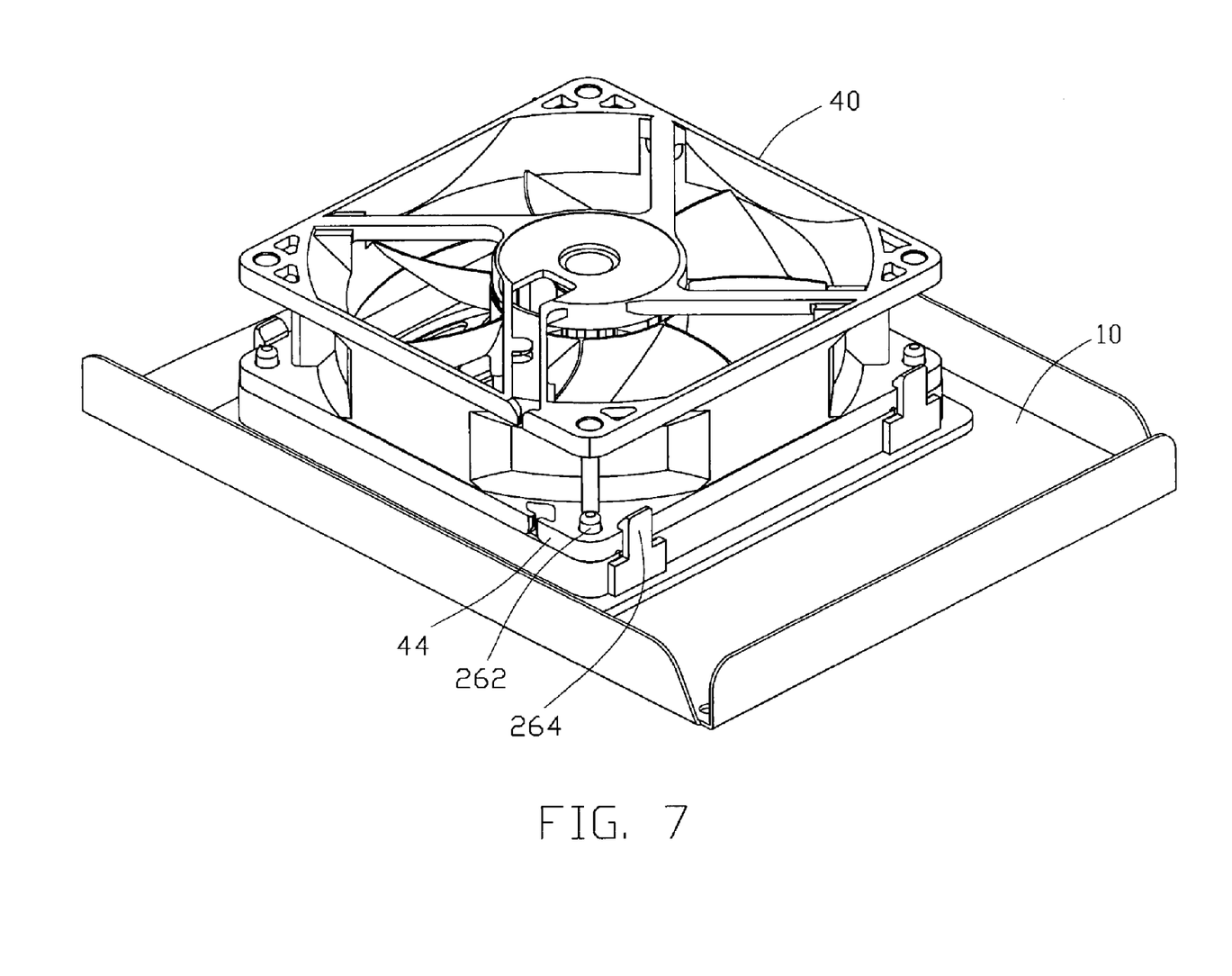
FIG. 7 is another assembled view of the fan holder of FIG. 1, with the second fan mounted to the fan holder.

Referring to FIGS. 6 and 7, in assembly of the first fan 30, the first locating posts 242 are aligned with and then extended through the corresponding mounting holes 342 of the lower panel 34. The first fan 30 is then pressed downward to urge the lower panel 34 of the first fan 30 resists against the first clasping portions 244. The first fan 30 is secured to the holder 20 until all the first clasping portions 244 jointly clamp an upper surface of the lower panel 34 of the first fan 30. Simultaneously, the projections 217 of the fingers 215 resist against a bottom surface of the lower panel 34 of the first fan 30. Thus, the lower panel 34 of the first fan 30 is securely sandwiched between the fingers 215 and the first clasping portions 244, thereby mounting the first fan 30 to the computer enclosure.

In removal of the first fan 30, the first clasping portions 244 are first pushed outward to urge the first clasping portions 244 to disengage from the upper surface of the lower panel 34 of the first fan 30. The first fan 30 is then lifted up until the first locating posts 242 of the holder 20 disengage from the mounting holes 342 of the lower panel 34 completely. Thus, the first fan 30 is removed from the holder 20.

After removal of the first fan 30, in assembly of the second fan 40, the second locating posts 262 are aligned with and then extended through the corresponding mounting holes 442 of the lower panel 44. The second fan 40 is then pressed downward to urge the lower panel 44 of the second fan 40 to resist against the second clasping portions 264. The second fan 40 is pressed to the holder 20 until all the second clasping portions 264 jointly clamp an upper surface of the lower panel 44 of the second fan 40. Simultaneously, the elastic projecting ends 233 of the side plates 23 resist against a bottom surface of the lower panel 44 of the second fan 40. Thus, the lower panel 44 of the second fan 40 is securely sandwiched between the side plates 23 and the second clasping portions 264, thereby mounting the second fan 40 to the computer enclosure.

In removal of the second fan 40, the second clasping portions 264 are firstly pushed outward to urge the second clasping portions 264 to disengage from the upper surface of the lower panel 44 of the second fan 40. The second fan 40 is then lifted up until the second locating posts 262 of the holder 20 disengage from the mounting holes 442 of the lower panel 44 completely. Thus, the second fan 40 is removed from the holder 20.

While the present invention has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present invention will readily appear to those skilled in the art. Therefore, the present invention is not limited to the specific details and illustrative examples shown and described.

What is claimed is:

1. A holder adapted to secure either a first fan or a second fan to a panel of a computer enclosure, the holder comprising:
   a bottom plate mounted to the panel of the computer enclosure;
   two opposite side plates being formed on and perpendicular to the bottom plate;
   a plurality of firs: clasping portions extending from the bottom plate for securing the first fan to the bottom plate between the side plates, the first clasping pardons being situated between the side plates; and
   a plurality of second clasping portions extending from the bottom plate and located at opposite sides of the side plates to the first clasping portions, the second clasping portions configured for securing the second fan on the side plates;
   wherein a plurality of projecting ends is formed on the side plates. and elastically deformable for securing the second fan between the second clasping portions and the side plates.

2. The holder as described in claim 1, wherein a plurality of latching holes is defined in the panel, and a plurality of catches is farmed on the bottom plate of the holder for engaging in the latching holes respectively, thereby mounting the holder to the panel.

3. The holder as described in claim 2, wherein at least one latching block is formed on the bottom plate of the holder, and at least one positioning hole is defined in the panel for engagingly receiving the at least one latching block therein.

4. The holder as described in claim 1, wherein a first locating post extends from the bottom plate beside each of the first clasping portions for locating the first fan, and a second locating post extends from the bottom plate beside each of the second clasping portions for locating the second fan.

5. The holder as described in claim 4, wherein the height of each of the side plates is not less than the height of the first clasping portions and the first locating posts.

6. The holder as described in claim 1, wherein the bottom plate defines an opening therein for drawing air from outside the computer enclosure.

7. The holder as described in claim 6, wherein an edge of the opening forms a plurality fingers with a projection for resisting against the first fan.

8. The holder as described in claim 1, wherein the first and second clasping portions are inversed Inward facing hooks.

9. A fan holder assembly comprising:
   a panel defining a plurality of latching holes therein;
   a first fan having a lower panel;
   a second fan having a lower panel; and
   a holder securely attached to the panel for securing either the second fan or the second fan, the holder comprising:
   a bottom plate having a plurality of catches for engaging in the latching holes of the panel respectively, thereby attaching the holder to the panel;
   a plurality of first clasping portions extending from the bottom plate for securing the first fan, and thereby sandwiching the lower panel of the first fan between the first clasping portions and the bottom plate; and
   a plurality of second clasping portions extending from the bottom plate for securing the second fan, and thereby sandwiching the lower panel of the second fan between the first clasping portions and the second clasping portions;

wherein a side date extends perpendicularly from the bottom plate between two near second clasping portions for supporting the second fan;

wherein a projecting end is formed at a top edge of the side dare. and elastically deformable for securing the second fan between the second clasping portions and the side plate.

10. The fan holder assembly as described in claim 9, wherein at least one latching block is formed an the bottom plate of the holder, and at least one positioning hole is defined in the panel for engagingly receiving the at least one latching black therein.

11. The fan holder assembly as described in claim 9, wherein a first locating post extends from the bottom plate beside each of the first clasping portions for locating the first fan, and a second locating post extends from the bottom plate beside each of the second clasping portions for locating the second fan.

12. The fan holder assembly as described in claim 9, wherein the height of the side plate is not less than the height of the first clasping portions and the first locating posts.

13. The fan holder assembly as described in claim 9, wherein the bottom plate defines an opening therein for drawing air from outside the panel.

14. The fan bolder assembly as described in claim 13, wherein an edge of the opening forms a plurality of fingers with a projection for resisting against the first fan.

15. The fan holder assembly as described in claim 9, wherein the first and second clasping portions are inversed inward facing hooks.

16. The holder as described in claim 1, wherein a distance between the bottom plate and a distal end of each of the plurality of first clasping portions is less than that between the bottom plate and a distal end of each of the plurality of second clasping portions.

* * * * *